United States Patent
Shih

(10) Patent No.: US 11,901,961 B2
(45) Date of Patent: Feb. 13, 2024

(54) INTERFACE CIRCUIT, MEMORY CONTROLLER AND METHOD FOR CALIBRATING SIGNAL PROCESSING DEVICES IN AN INTERFACE CIRCUIT OF A MEMORY CONTROLLER

(71) Applicant: Silicon Motion, Inc., Hsinchu County (TW)

(72) Inventor: Fu-Jen Shih, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 15 days.

(21) Appl. No.: 17/951,090

(22) Filed: Sep. 22, 2022

(65) Prior Publication Data
US 2023/0171005 A1 Jun. 1, 2023

Related U.S. Application Data

(60) Provisional application No. 63/283,981, filed on Nov. 29, 2021.

(30) Foreign Application Priority Data

Mar. 23, 2022 (TW) .................. 111110888

(51) Int. Cl.
*H04B 17/11* (2015.01)
*H04J 3/04* (2006.01)
*H04B 17/21* (2015.01)

(52) U.S. Cl.
CPC ............ *H04B 17/11* (2015.01); *H04B 17/21* (2015.01); *H04J 3/04* (2013.01)

(58) Field of Classification Search
CPC . H04B 17/11; H04B 17/21; H04J 3/04; G11C 29/022; G11C 29/028;
(Continued)

(56) References Cited

U.S. PATENT DOCUMENTS 10,128,892 B1    11/2018  Moghaddas
2011/0239031 A1*  9/2011  Ware .................. G11C 7/22
                                              713/500

(Continued)

FOREIGN PATENT DOCUMENTS

TW    200703951       1/2007
TW    202037097 A    10/2020
TW    202037107 A    10/2020

*Primary Examiner* — Fitwi Y Hailegiorgis
(74) *Attorney, Agent, or Firm* — Winston Hsu

(57) ABSTRACT

A method, for calibrating signal processing devices in an interface circuit coupled to a host device in a link, comprises: negotiating with the host device in a link up process about an operation mode for the interface circuit to operate in a calibration procedure; and calibrating a characteristic value of a first signal processing device and a characteristic value of a second signal processing device in the calibration procedure. The first signal processing device is disposed on a receiving signal processing path and configured to process a received signal and the second signal processing device is disposed on a transmitting signal processing path and configured to process a transmitting signal, and the interface circuit is configured to operate based on the operation mode in the calibration procedure.

17 Claims, 12 Drawing Sheets

(58) Field of Classification Search
CPC ... H04L 7/0058; Y02D 10/00; G06F 13/1673; G06F 13/4068; G06F 13/4282
USPC .......................................................... 375/222
See application file for complete search history.

(56) References Cited

U.S. PATENT DOCUMENTS

2016/0227004 A1* 8/2016 Conner ................. H04L 7/0041
2018/0062726 A1   3/2018 Waight

* cited by examiner

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_PA | | | | | | | | EscParam_PA = PACP_BEGIN | | | | | | | |
| 0 | PACP_FunctionID = PACP_CAP_EXT2_ind | | | | | | | | | | | | | | | |
| 0 | AdMod | | Reserved | | | | | | | | | | | | | MaxHS |
| 0 | RxHsG4PrepareLength | | | | | | | | RxHsG4SyncLength | | | | | | | |
| 0 | RxHsAdaptResfresh | | | | | | | | RxHsAdaptInitial | | | | | | | |
| 0 | Reserved | | | | | | | | | | | | | | | |
| 0 | Reserved | | | | | | | | | | | | | | | |
| 0 | Reserved | | | | | | | | | | | | | | | |
| 0 | Reserved | | | | | | | | | | | | | | | |
| 0 | Reserved | | | | | | | | | | | | | | | |
| 0 | Reserved | | | | | | | | | | | | | | | |
| 0 | Reserved | | | | | | | | | | | | | | | |
| 0 | Reserved | | | | | | | | | | | | | | | |

FIG. 8

INTERFACE CIRCUIT, MEMORY CONTROLLER AND METHOD FOR CALIBRATING SIGNAL PROCESSING DEVICES IN AN INTERFACE CIRCUIT OF A MEMORY CONTROLLER

CROSS REFERENCE TO RELATED APPLICATIONS

This application claims the benefit of U.S. Provisional Application No. 63/283,981, filed on Nov. 29, 2021. The content of the application is incorporated herein by reference.

BACKGROUND OF THE INVENTION

1. Field of the Invention

The present invention is related to a method for calibrating an interface circuit in a high-speed communication system.

2. Description of the Prior Art

Serializer-Deserializer (SerDes) is a pair of function blocks commonly used in high-speed communication to compensate for limited input/output. SerDes is configured to convert data between serial data and parallel interfaces in either direction. The primary use of a SerDes is to provide data transfer over a single line or a differential pair to minimize the number of input/output pins and interconnects.

The SerDes operates at high frequency. However, high frequency signal transmission has low tolerance to frequency or voltage jitter. Therefore, if the characteristic values of the signal processing devices in the SerDes shift, the frequency or voltage jitter caused by the shift may cause fatal errors to the signal processing in SerDes. Once a fatal error occurs, the system must be powered off or reset, which becomes a serious problem and causes a lot of inconvenience.

In order to avoid causing fatal errors in a high-speed communication system, a method for calibrating an interface circuit comprising a SerDes in the high-speed communication system is required.

SUMMARY OF THE INVENTION

It is an objective of the invention to provide a method for calibrating an interface circuit comprising a SerDes in a high-speed communication system to avoid undesired frequency or voltage jitter caused by characteristic value shifts, thereby preventing the fatal from occurring in the high-speed communication system.

According to an embodiment of the invention, an interface circuit comprises a first signal processing device, a second signal processing device and a calibration device. The first signal processing device is disposed on a receiving signal processing path and configured to process a received signal. The second signal processing device us disposed on a transmitting signal processing path and configured to process a transmitting signal. The calibration device is coupled to the first signal processing device and the second signal processing device and configured to calibrate a characteristic value of the first signal processing device and a characteristic value of the second signal processing device in a calibration procedure. The first signal processing device is coupled to an external signal receiving path and an internal signal receiving path and is configured to sequentially process the received signal received from the external signal receiving path and the received signal received from the internal signal receiving path in the calibration procedure. The second signal processing device is coupled to the first signal processing device via the internal signal receiving path and is configured to provide the transmitting signal to the first signal processing device in the calibration procedure.

According to an embodiment of the invention, a memory controller coupled to a memory device for controlling access operations of the memory device comprises an interface circuit. The interface circuit is coupled to a host device and configured to communicate with the host device. The interface circuit comprises a first signal processing device, a second signal processing device and a calibration device. The first signal processing device is disposed on a receiving signal processing path and configured to process a received signal. The second signal processing device is disposed on a transmitting signal processing path and configured to process a transmitting signal. The calibration device is coupled to the first signal processing device and the second signal processing device and configured to calibrate a characteristic value of the first signal processing device and a characteristic value of the second signal processing device in a calibration procedure. The first signal processing device is coupled to an external signal receiving path and an internal signal receiving path and is configured to sequentially process the received signal received from the external signal receiving path and the received signal received from the internal signal receiving path in the calibration procedure. The second signal processing device is coupled to the first signal processing device via the internal signal receiving path and is configured to provide the transmitting signal to the first signal processing device in the calibration procedure.

According to an embodiment of the invention, a method, for calibrating signal processing devices in an interface circuit of a memory controller which is coupled to a memory device for controlling access to the memory device and comprised in a data storage device that is coupled to a host device, comprises: negotiating with the host device in a link up process about an operation mode for the interface circuit to operate in a calibration procedure; and calibrating a characteristic value of a first signal processing device and a characteristic value of a second signal processing device in the calibration procedure. The first signal processing device is disposed on a receiving signal processing path of the interface circuit and configured to process a received signal, the second signal processing device is disposed on a transmitting signal processing path of the interface circuit and configured to process a transmitting signal, and the interface circuit is configured to operate based on the operation mode in the calibration procedure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 shows an exemplary data structure of the capability indication command PACP_CAP_EXT2_ind according to an embodiment of the invention.

DETAILED DESCRIPTION

In the following, numerous specific details are described to provide a thorough understanding of embodiments of the invention. However, one of skilled in the art will understand how to implement the invention in the absence of one or more specific details, or relying on other methods, elements or materials. In other instances, well-known structures, materials or operations are not shown or described in detail in order to avoid obscuring the main concepts of the invention.

Reference throughout this specification to "one embodiment", "an embodiment", "one example" or "an example" means that a particular feature, structure or characteristic described in connection with the embodiment or example is included in at least one embodiment of a plurality of embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

In addition, in order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof.

Figure 1:
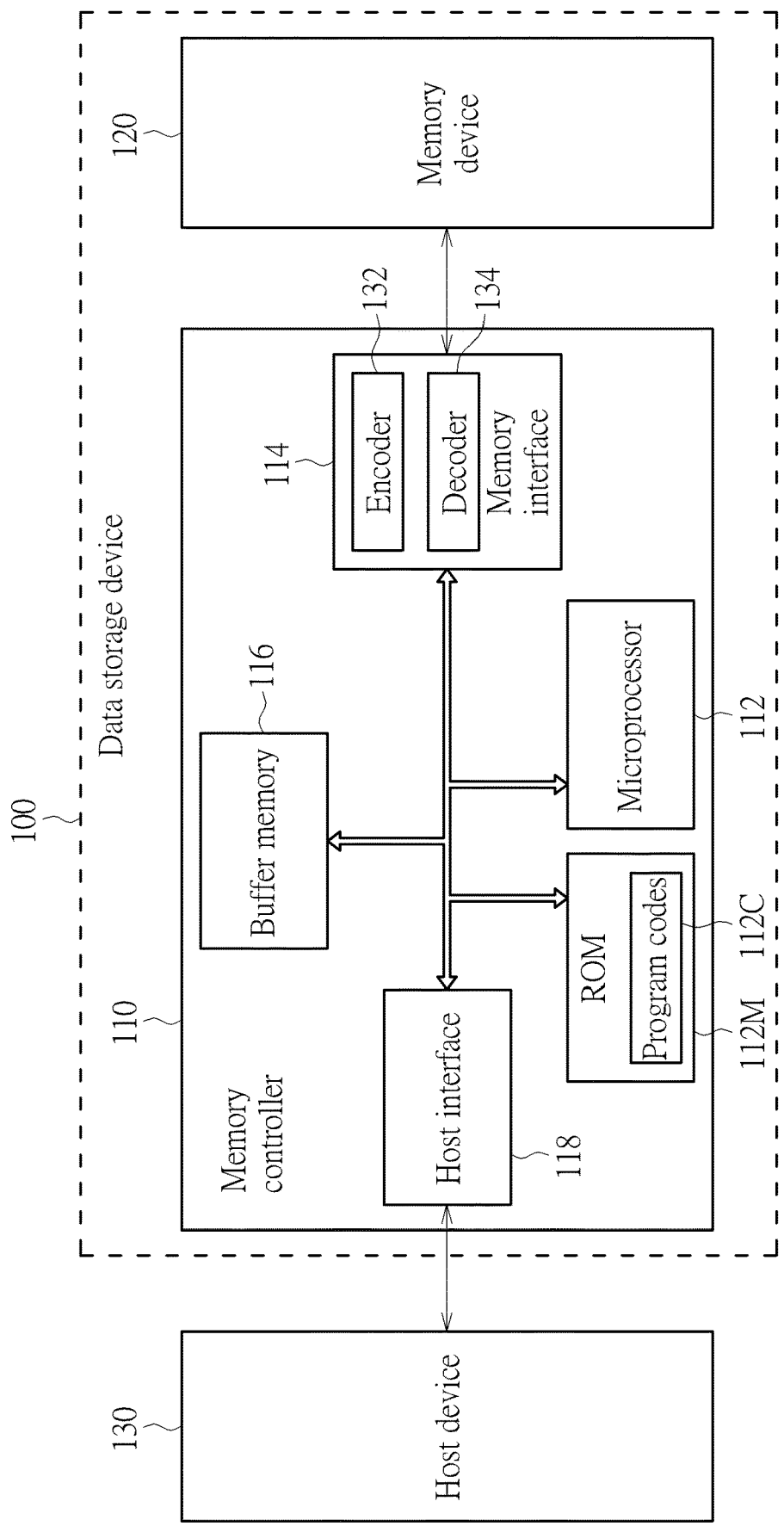
FIG. 1 shows an exemplary block diagram of a data storage device according to an embodiment of the invention.

FIG. 1 shows an exemplary block diagram of a data storage device according to an embodiment of the invention. The data storage device 100 may comprise a memory device 120 and a memory controller 110. The memory controller 110 is configured to access the memory device 120 and control operations of the memory device 120. The memory device 120 may be a non-volatile (NV) memory (e.g. a Flash memory) device and may comprise one or more memory elements (e.g. one or more Flash memory dies, or one or more Flash memory chip, or the likes).

The data storage device 100 may be coupled to a host device 130. The host device 130 may comprise at least one processor, a power supply circuit, and at least one random access memory (RAM), such as at least one dynamic RAM (DRAM), at least one static RAM (SRAM), . . . etc. (not shown in FIG. 1). The processor and the RAM may be coupled to each other through a bus, and may be coupled to the power supply circuit to obtain power. The processor may be arranged to control operations of the host device 130, and the power supply circuit may be arranged to provide the processor, the RAM, and the data storage device 100 with power. For example, the power supply circuit may output one or more driving voltages to the data storage device 100. The data storage device 100 may obtain the one or more driving voltages from the host device 130 as the power of the data storage device 100 and provide the host device 130 with storage space.

According to an embodiment of the invention, the host device 130 may issue commands, such as the read command or the write command, to the data storage device 100, so as to access the data stored in the memory device 120, or the host device 130 may issue commands to further control or manage the data storage device 100.

According to an embodiment of the invention, the memory controller 110 may comprise a microprocessor 112, a Read Only Memory (ROM) 112M, a memory interface 114, a buffer memory 116 and a host interface 118. The ROM 112M is configured to store program codes 112C. The microprocessor 112 is configured to execute the program codes 112C, thereby controlling access to the memory device 120. The program codes 112C may comprise one or more program modules, such as the boot loader code. When the data storage device 100 obtains power from the host device 130, the microprocessor 112 may perform an initialization procedure of the data storage device 100 by executing the program codes 112C. In the initialization procedure, the microprocessor 112 may load a group of In-System Programming (ISP) codes (not shown in FIG. 1) from the memory device 120. The microprocessor 112 may execute the group of ISP codes, so that the data storage device 100 has various functions. According to an embodiment of the invention, the group of ISP codes may comprise, but are not limited to: one or more program modules related to memory access (e.g. read, write and erase), such as a read operation module, a table lookup module, a wear leveling module, a read refresh module, a read reclaim module, a garbage collection module, a sudden power off recovery (SPOR) module and an uncorrectable error correction code (UECC) module, respectively provided for performing the operations of read, table lookup, wear leveling, read refresh, read reclaim, garbage collection, SPOR and error handling for detected UECC error.

The memory interface 114 may comprise an encoder 132 and a decoder 134. The encoder 132 is configured to encode the data to be written into the memory device 120, such as performing ECC encoding. The decoder 134 is configured decode the data read out from the memory device 120.

Typically, the memory device 120 may comprise a plurality of memory elements, such as a plurality of Flash memory dies or Flash memory chips, and each memory element may comprise a plurality of memory blocks. The access unit of an erase operation performed by the memory controller 110 on the memory device 120 may be one memory block. In addition, a memory block may record (comprise) a predetermined number of pages, for example, the physical pages, and the access unit of a write operation performed by the memory controller 110 on the memory device 120 may be one page.

In practice, the memory controller 110 may perform various control operations by using its own internal components. For example, the memory controller 110 may use the memory interface 114 to control the access operations (especially the access operation for at least a memory block or at least a page) of the memory device 120, use the buffer memory 116 to perform necessary data buffer operations, and use the host interface 118 to communicate with the host device 130.

In an embodiment of the invention, the memory controller 110 may use the host interface 118 to communicate with the host device 130 in compliance with a standard communication protocol. For example, the standard communication protocol may comprise (but is not limited to) the Universal Serial Bus (USB) standard, the SD interface standard, the Ultra High Speed-I (UHS-I) interface standard, the Ultra High Speed-II (UHS-II) interface standard, the CF interface standard, the Multi Media Card (MMC) interface standard, the eMMC interface standard, the UFS interface standard, the Advanced Technology Attachment (ATA) standard, the Serial ATA (SATA) standard, the Peripheral Component Interconnect Express (PCI-E) standard, the Parallel Advanced Technology Attachment (PATA) standard, etc.

In an embodiment, the buffer memory 116 may be implemented by a RAM. For example, the buffer memory 116 may be an SRAM, but the invention should not be limited thereto. In other embodiments, the buffer memory 116 may be a DRAM.

In an embodiment of the invention, the data storage device 100 may be a portable storage device (for example, the memory card in compliance with the SD/MMC, CF, MS and/or XD standard or the USB flash drives), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the UFS or the eMMC standards, and may be equipped in an electronic device such as a mobile phone, a notebook computer, or a desktop computer. In such an embodiment, the host device 130 may be a processor of the electronic device.

According to an embodiment of the invention, the host interface 118 of the memory controller 110 may comprise a Serializer-Deserializer (SerDes) configured to process a received signal that is received from the host device and a transmitting signal that is to be transmitted to the host device, to achieve high-speed data and signal transmission between the data storage device 100 and the host device 130.

Figure 2:
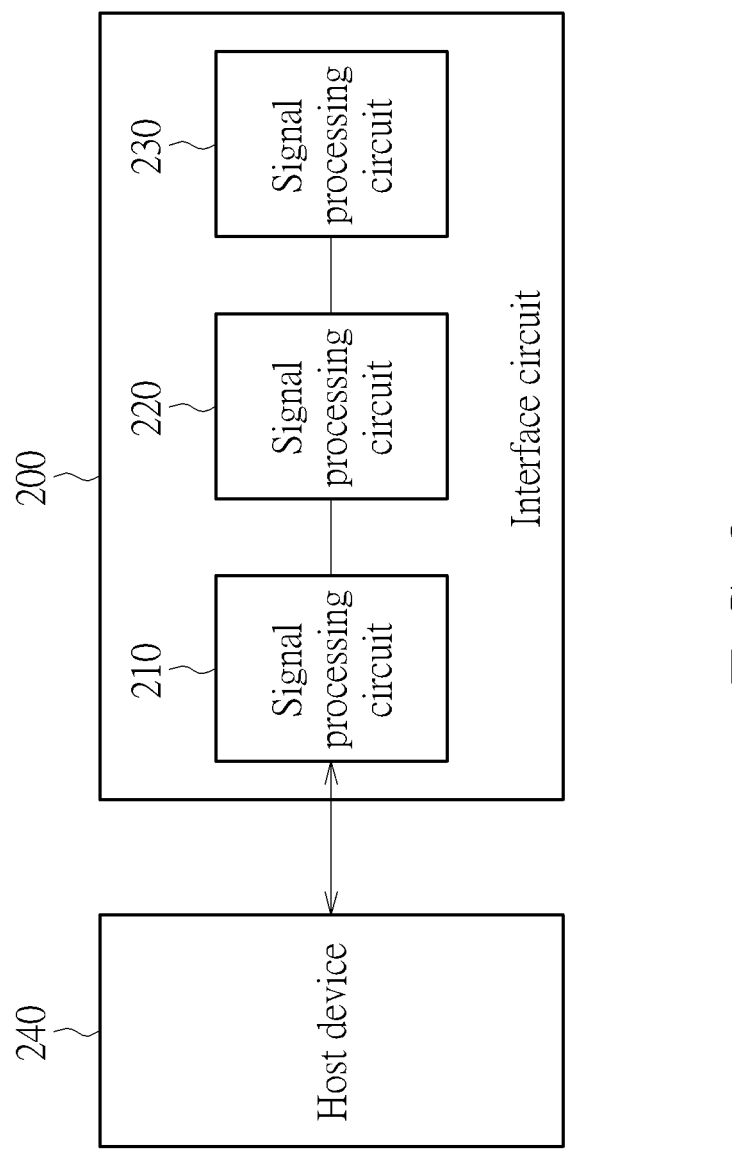
FIG. 2 shows an exemplary block diagram of an interface circuit according to an embodiment of the invention.

FIG. 2 shows an exemplary block diagram of an interface circuit according to an embodiment of the invention. According to an embodiment of the invention, the interface circuit 200 may be a host interface arranged between a predetermined device (as an example, a data storage device) and a host device 240, so that the host device 240 and the predetermined device are able to communicate with each other and transmit data signals and control signals through the interface circuit 200. According to an embodiment, the interface circuit 200 may be the host interface 118 comprised in the memory controller 110.

The interface circuit 200 may comprise signal processing circuits 210, 220, and 230 that operate in compliance with different layers of communication protocols. The signal processing circuit 210 may be a physical layer signal processing circuit for processing the received signal that is received from the host device 240 and a transmitting signal that is to be transmitted to the host device 240 according to the physical layer communication protocol. For example, the signal processing circuit 210 may perform operations such as amplification or attenuation, analog-to-digital conversion, frequency up-conversion or down-conversion and basic encoding or decoding on the received signal and the transmitting signal, and may also perform operations of physical layer packet disassembling.

The signal processing circuit 220 may be a protocol layer signal processing circuit for performing corresponding signal processing on the received signal and the transmitting signal in compliance with the communication protocol higher than the physical layer. For example, the signal processing circuit 220 may perform corresponding signal processing on the received signal and the transmitting signal in compliance with the Unified Protocol (UniPro) developed by the Mobile Industry Processor Interface (MIPI) alliance. The internal components of the signal processing circuit 220 may be further divided into multiple layers of signal processing circuits, for example, a Physical Adapter (PA) layer signal processing circuit which is connected to the physical layer signal processing circuit, and other layers above the PA layer of signal processing circuits. The signal processing circuit 230 may be an application layer signal processing circuit for performing signal processing in compliance with the application layer communication protocol which is higher than the physical layer and the protocol layer communication protocols.

In the embodiments of the invention, the signal processing circuit 210 may be a serializer-deserializer (SerDes) or a physical layer signal processing circuit of a SerDes, to implement the aforementioned high-speed data and signal transmission between the predetermined device and the host device.

Figure 3:
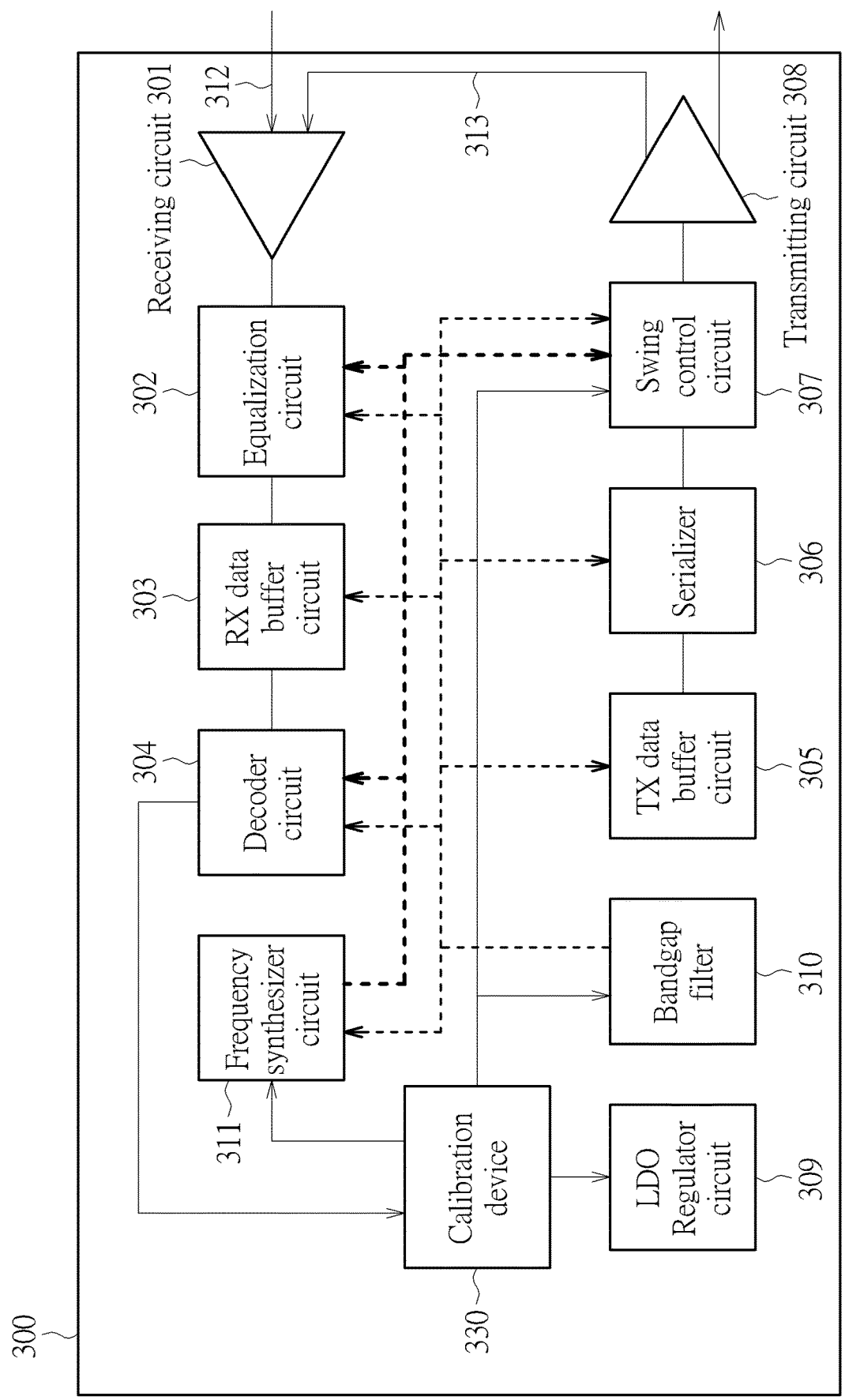
FIG. 3 shows an exemplary block diagram of a signal processing circuit according to an embodiment of the invention.

FIG. 3 shows an exemplary block diagram of a signal processing circuit according to an embodiment of the invention. In this embodiment, the signal processing circuit 300 may be a physical layer signal processing circuit comprised in an interface circuit, for example, a physical layer signal processing circuit in the host interface of a memory controller, or, the signal processing circuit 300 may be a SerDes, or the physical layer signal processing circuit of a SerDes comprised in a memory controller, and may be configured to process the received signal and the transmitting signal.

The signal processing circuit 300 may comprise a plurality of signal processing devices and a calibration device 330. The calibration device 330 is coupled to a plurality of signal processing devices to sequentially calibrate a characteristic value of the signal processing devices in a calibration procedure. The signal processing devices in the signal processing circuit 300 may comprise: a receiving (RX) circuit 301, an equalization circuit 302, a receiving (RX) data buffer circuit 303, a decoder circuit 304, a transmitting (TX) data buffer circuit 305, a serializer 306, a swing control circuit 307, a transmitting circuit 308, a low dropout (LDO) regulator circuit 309, a bandgap filter 310 and a frequency synthesizing circuit 311.

It is to be noted that FIG. 3 is a simplified schematic diagram of the signal processing circuit, in which only the components relevant to the invention are shown. As will be readily appreciated by a person of ordinary skill in the art, a physical layer signal processing circuit may further comprise other components not shown in FIG. 3 and configured to implement functions of corresponding physical layer signal processing.

On the RX signal processing path, the receiving circuit 301 is configured to receive signals from either an external signal receiving path 312 or an internal signal receiving path 313. The equalization circuit 302 is configured to perform equalization on the received signal received from the receiving circuit 301. In the embodiments of the invention, since the equalization circuit 302 is coupled to both the external signal receiving path 312 and the internal signal receiving path 313 via the receiving circuit 301, the equalization circuit 302 is configured to perform equalization on the received signal received by the receiving circuit 301 from the external signal receiving path 312 and is also configured to perform equalization on the received signal received by the receiving circuit 301 from internal signal receiving path 313.

In an embodiment of the invention, the equalization circuit 302 may comprise a Continuous Time Linear Equalizer (CTLE), a Clock Data Recovery (CDR) circuit and a Deserializer (not shown in FIG. 3). The CTLE is configured to perform equalization on the received signal, which is a serial signal. The CDR circuit is configured to regenerate a clock signal that is synchronized with the one used by the transmitter according to the received signal, and try to accurately recover the content of data signal carried in the received signal according to the clock signal. The deserializer is configured to convert the serial data signal into parallel data signals, and is configured to output the data signals that are transmitted in parallel via a plurality of buses. The RX data buffer circuit 303 is configured to buffer the received data output by the equalization circuit 302. The decoder circuit 304 is configured to decode the received data. The decoded data will be further provided to a upper layer signal processing circuit, such as the aforementioned physical adaptation layer signal processing circuit.

On the TX signal processing path, the TX data buffer circuit 305 is configured to buffer the TX data, which may be parallel data signals, provided by the upper layer signal processing circuit. The serializer 306 is configured to convert the parallel data signals into a serial data signal. The swing control circuit 307 is configured to control the swing of the TX signal, for example, to adjust the voltage of the TX signal to an appropriate level. The transmitting circuit 308 is configured to transmit out the TX signal, for example, transmit to the host device.

Besides the signal processing devices on the TX signal processing path and the RX signal processing path described above, the signal processing circuit 300 may also comprise some common circuits for providing frequency, current, voltage and/or power required by other signal processing devices. The LDO regulator 309 is configured to provide a stable voltage signal. For example, a stable voltage signal is provided to the bandgap filter 310. The bandgap filter 310 is configured to filter noise in the voltage signal and to provide a clean voltage signal to other signal processing devices (as shown by the thin dashed line in the figure). The frequency synthesizer circuit 311 is configured to generate the internal clock signal required by the signal processing circuit 300 and provide the clock signal to other signal processing devices (as shown by the thick dashed line in the figure). In one embodiment of the invention, the frequency synthesizer circuit 311 may be implemented by a phase locked loop (PLL) which generates an oscillating signal and provide it as the internal clock signal required by the signal processing circuit 300

According to an embodiment of the invention, the calibration device 330 is configured to sequentially calibrate a characteristic value of a plurality of signal processing devices (for example, at least a first signal processing device and a second signal processing device) in a calibration procedure. In addition, according to an embodiment of the invention, the calibration procedure may be triggered in responsive of a power mode change request issued by the host device, such as the host device 130 coupled to the data storage device 100 or the host device 240 coupled to the interface circuit 200.

Figure 4:
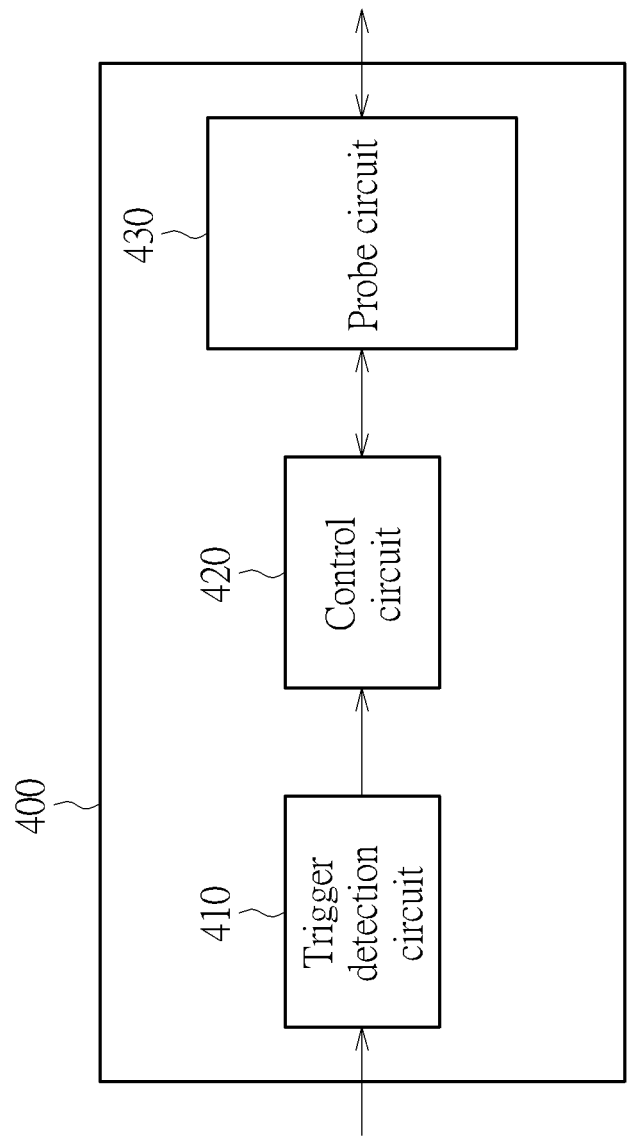
FIG. 4 shows an exemplary block diagram of a calibration device according to an embodiment of the invention.

FIG. 4 shows an exemplary block diagram of a calibration device according to an embodiment of the invention. The calibration device 400 may comprise a trigger detection circuit 410, a control circuit 420 and a probe circuit 430. The trigger detection circuit 410 is configured to detect whether the calibration procedure is triggered by the upper layer signal processing circuit. According to an embodiment of the invention, the trigger detection circuit 410 may detect whether the calibration procedure is triggered by detecting whether a trigger signal has been issued by the PA layer signal processing circuit (e.g. the PA layer signal processing circuit in the signal processing circuit 220).

According to an embodiment of the invention, when a power mode change request (e.g. the power mode change request PACP_PWR_REQ) issued by the host device has been received, the PA layer signal processing circuit may further detect whether activation of an adapt equalization is indicated in the power mode change request. The host device may carry information regarding activation of an adapt equalization and the parameters configured for the adapt equalization, such as the adapt length, the adapt range, the adapt period . . . etc., in the power mode change request. When activation of an adapt equalization is indicated in the power mode change request, the PA layer signal processing circuit may send a trigger signal to the calibration device 400. Upon receiving the trigger signal, the trigger detection circuit 410 may notify the control circuit 420 to start performing a calibration procedure. Therefore, in the embodiments of the invention, the calibration procedure may be triggered when activation of an adapt equalization is indicated in the power mode change request.

It is to be noted that in the embodiments of the invention, the calibration procedure is an advanced or improved Adapt Equalization. In the calibration procedure, the calibration device (e.g. the calibration device 330 or 400) is configured to calibrate a characteristic value of a first signal processing device which is disposed on the RX signal processing path and configured to process a received signal and also calibrate a characteristic value of a second signal processing device which is disposed on the TX signal processing path and configured to process a transmitting signal. In an embodiment of the invention, the first signal processing device to be calibrated in the calibration procedure may be the equalization circuit 302 as shown in FIG. 3 and the second signal processing device to be calibrated in the calibration procedure may be the swing control circuit 307 as shown in FIG. 3.

The control circuit 420 is coupled to the trigger detection circuit 410 and the probe circuit 430 and is configured to start the calibration procedure in one or more adapt periods in response to the notification from the trigger detection circuit 410. The probe circuit 430 is coupled to the control circuit 420 and at least the first signal processing device and the second signal processing device in the signal processing circuit and is configured to sequentially probe the signal processing devices coupled thereto to generate a corresponding probe result. The obtained probe results are sequentially provided to the control circuit 420 for the control circuit to sequentially adjust the corresponding characteristic value of each signal processing device in the calibration procedure.

According to a first embodiment of the invention, the probe circuit 430 may comprise one analog-to-digital converter (ADC) circuit that is arranged to sequentially probe some parameters in the signal processing circuit, for example, the current voltage level of the power source, the current voltage level of the ground voltage and the parameters of the signal processing devices to be calibrated. The order of probing the parameters of the signal processing devices may be flexibly designed based on the operation mode configured for the interface circuit in the calibration procedure (will be discussed in the following paragraphs). Therefore, in the first embodiment of the invention, the ADC circuit in the probe circuit 430 may be shared by the signal processing devices to be calibrated.

According to a second embodiment of the invention, the probe circuit 430 may comprise a plurality of ADC circuits, and each signal processing device to be calibrated may be equipped with one dedicated ADC circuit for probing the corresponding parameter. In addition, at least one of the ADC circuits may be arranged to probe the current voltage level of the power source and the current voltage level of the ground voltage that will be provided as references.

As mentioned above, in the embodiment of the invention, the first signal processing device to be calibrated in the calibration procedure may be the equalization circuit 302 as shown in FIG. 3 and the second signal processing device to be calibrated in the calibration procedure may be the swing control circuit 307 as shown in FIG. 3.

Regarding the equalization circuit 302, in the calibration procedure, the probe circuit 430 is configured probe the voltage level of the data signals output by the equalization circuit 302, convert the values of the probed voltage level, which are analog values, into digital values and provide the digital probed values as the probe results to the control circuit 420.

Regarding the swing control circuit 307, in the calibration procedure, the probe circuit 430 is configured probe the voltage level of transmitting signals output by the swing control circuit 307, convert the values of the probed voltage level, which are analog values, into digital values and provide the digital probed values as the probe results to the control circuit 420.

According to an embodiment, the swing control circuit 307 is coupled to the equalization circuit 302 via the transmitting circuit 308, the internal signal receiving path 313 and the receiving circuit 301. In the calibration procedure, the transmitting signals output by the swing control circuit 307 may be provided to the equalization circuit 302 via the internal signal receiving path 313 for performing an internal loop calibration.

Figure 5:
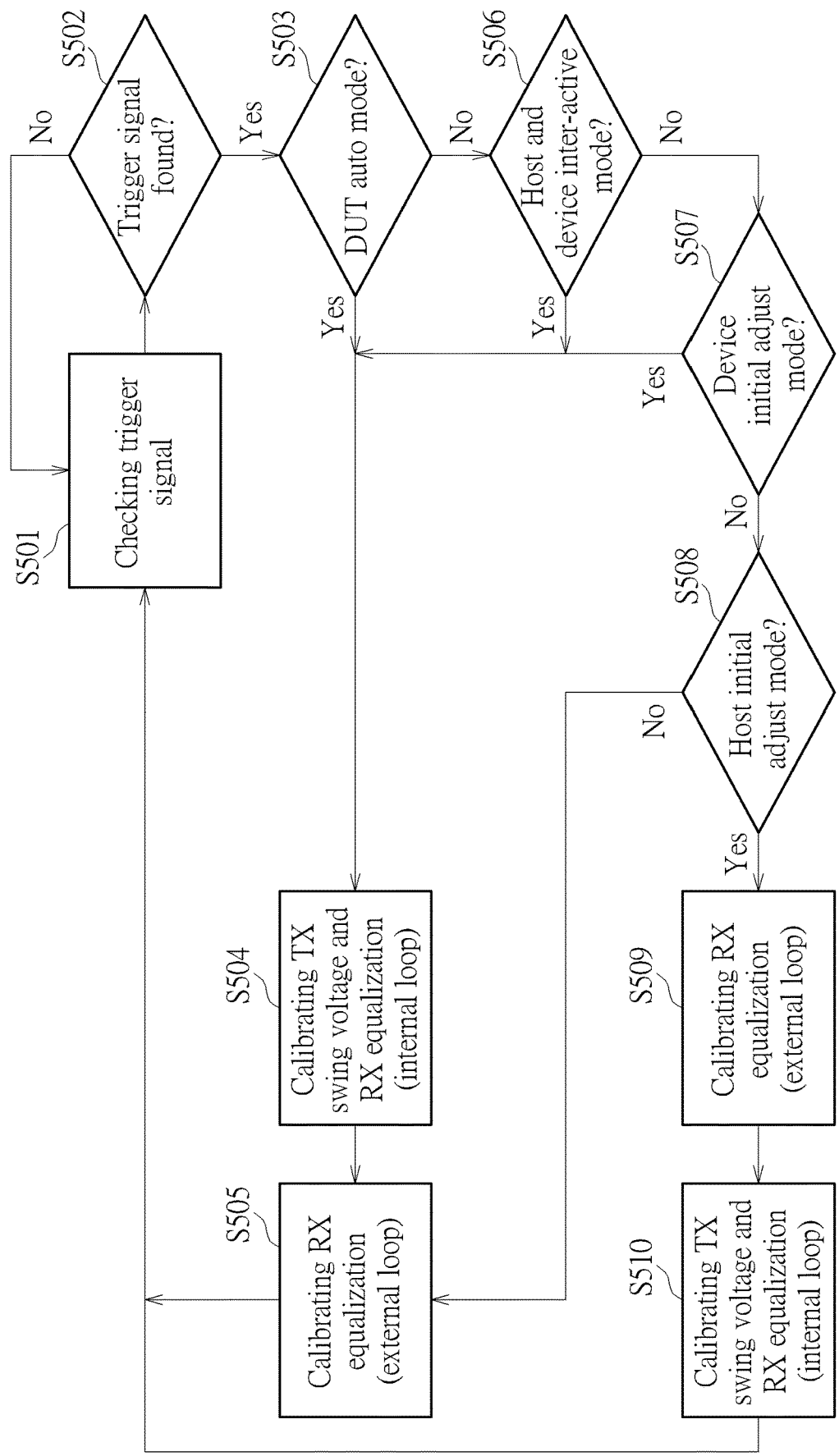
FIG. 5 shows an exemplary flow chart of a calibration procedure controlled by the calibration device according to an embodiment of the invention.

FIG. 5 shows an exemplary flow chart of a calibration procedure controlled by the calibration device according to an embodiment of the invention. The trigger detection circuit 410 may operate in a standby sate in step S501 to check whether a trigger signal is issued by the PA layer signal processing circuit. When the trigger signal is found in step S502, the trigger detection circuit 410 notifies the control circuit 420 to start performing a calibration procedure.

The control circuit 420 may determine which operation mode is configured for the interface circuit (or, configured for the data storage device or the memory controller comprising the interface circuit) before starting the calibration procedure. In step S503, the control circuit 420 may determine whether a Device Under Test (DUT) auto mode is configured for the interface circuit. If the DUT auto mode is the operation mode configured for the interface circuit, the control circuit 420 may perform the internal loop calibration to calibrate the TX swing voltage output by the swing control circuit 307 and the equalization parameter of the equalization circuit 302 (that is, the RX Equalization) via the internal signal receiving path 313 first in step S504, and then perform the external loop calibration to calibrate the equalization parameter of the equalization circuit 302 via the external signal receiving path 312 in step S505.

If the DUT auto mode is not the operation mode configured for the interface circuit, the control circuit 420 may further determine whether a host and device inter-active mode is configured for the interface circuit in step S506. If the host and device inter-active mode is the operation mode configured for the interface circuit, the control circuit 420 may perform the internal loop calibration in step S504, and then perform the external loop calibration in step S505.

If the host and device inter-active mode is not the operation mode configured for the interface circuit, the control circuit 420 may further determine whether a device initial adjust mode is configured for the interface circuit in step S507. If the device initial adjust mode is the operation mode configured for the interface circuit, the control circuit 420 may perform the internal loop calibration in step S504, and then perform the external loop calibration in step S505.

If the device initial adjust mode is not the operation mode configured for the interface circuit, the control circuit 420 may further determine whether a host initial adjust mode is configured for the interface circuit in step S508. If the host initial adjust mode is the operation mode configured for the interface circuit, the control circuit 420 may perform the external loop calibration in step S509, and then perform the internal loop calibration in step S510. If the host initial adjust mode is not the operation mode configured for the interface circuit, the control circuit 420 may only perform the external loop calibration in step S505.

According to an embodiment of the invention, the calibration device (e.g. the calibration device 330, 400) is configured to operate based on the aforementioned operation mode of the interface circuit in the calibration procedure, and the interface circuit may negotiate with the host device (e.g. the host device 130, 240) about the operation mode in a link up process.

Figure 6:
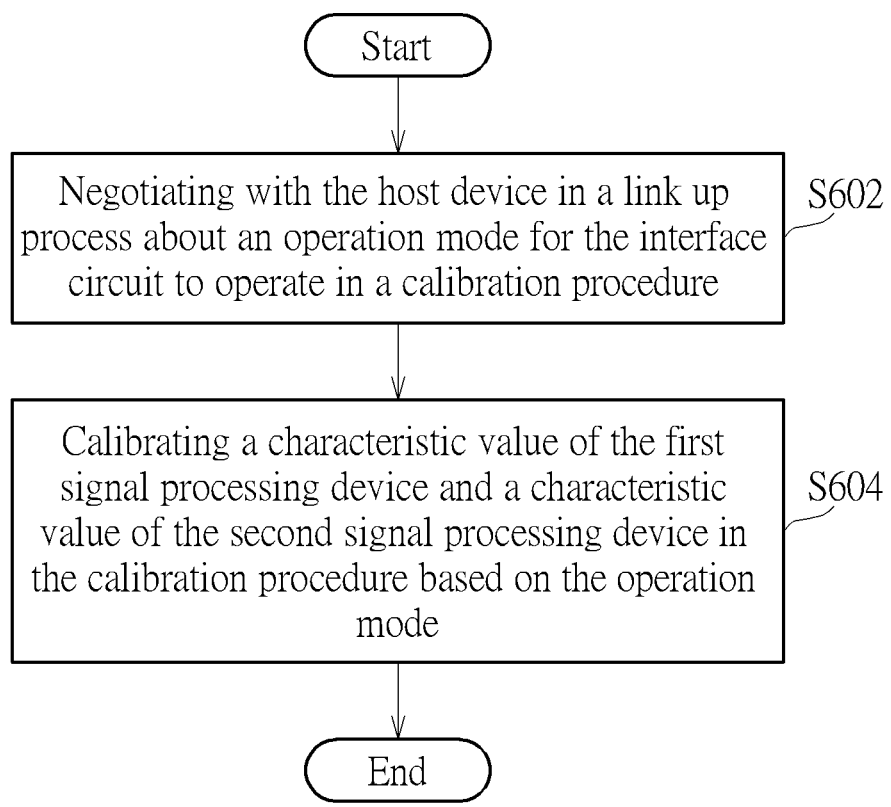
FIG. 6 shows an exemplary flow chart of a method for calibrating signal processing devices in an interface circuit of a memory controller according to an embodiment of the invention.

FIG. 6 shows an exemplary flow chart of a method for calibrating signal processing devices in an interface circuit of a memory controller according to an embodiment of the invention. The method may comprise the following steps:

Step S602: negotiating with the host device in a link up process about an operation mode for the interface circuit to operate in a calibration procedure.

Step S604: calibrating a characteristic value of the first signal processing device and a characteristic value of the second signal processing device in the calibration procedure based on the operation mode.

In the embodiments of the invention, the detailed flow of the calibration performed in step S604 based on the operation mode may refer to the flow chart illustrated above in FIG. 5.

Figure 7:
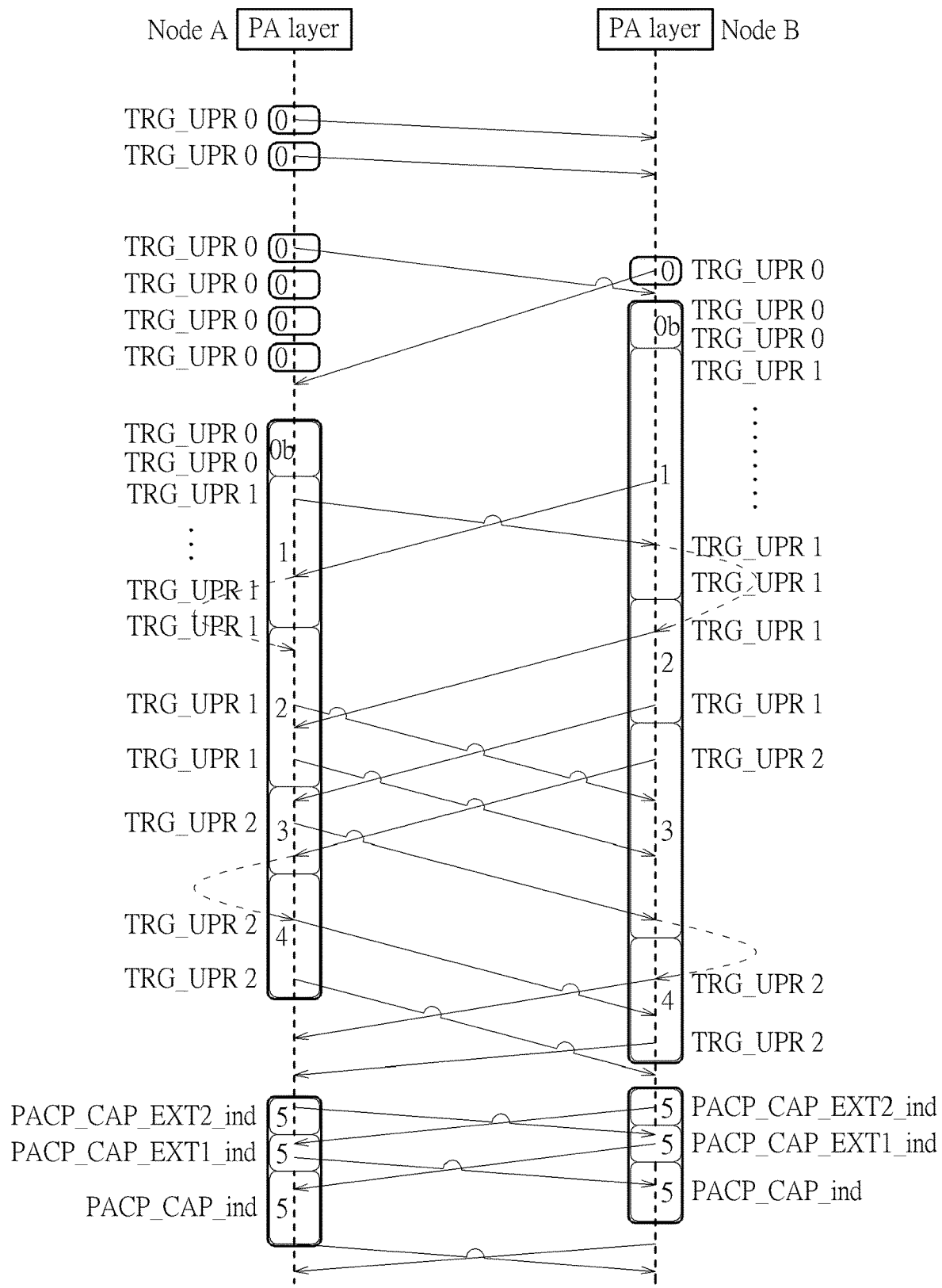
FIG. 7 shows an exemplary flow chart of a link up process performed by a Node A device and a Node B device according to an embodiment of the invention.

FIG. 7 shows an exemplary flow chart of a link up process performed by a Node A device (for example, a host device) and a Node B device (for example, a data storage device or the interface circuit) according to an embodiment of the invention. In the link up process, the Node A device and the Node B device are trying to link up with each other. As an example, transmitting the triggering event messages TRG_UPR 0, TRG_UPR 1, TRG_UPR 2, . . . etc. during the link startup phases 0-4. After linking up with each other, the capability information is exchanged between the Node A device and the Node B. According to an embodiment of the invention, the capability information may be exchanged between the Node A device and the Node B via one or more capability indication commands, such as the capability indication commands PACP_CAP_ind, PACP_CAP_EXT1_ind and PACP_CAP_EXT2_ind shown in FIG. 7. According to an embodiment of the invention, information regarding the operation mode supported by a node device may be carried in the capability indication command PACP_CAP_EXT2_ind. After exchanging the information regarding the supported operation mode, the host device may make the final decision to determine which operation mode is configured for the interface circuit based on the exchanged capability information.

FIG. 8 shows an exemplary data structure of the capability indication command PACP_CAP_EXT2_ind according to an embodiment of the invention. The capability indication command may comprise a plurality fields for carrying information regarding capabilities of the corresponding devices. For example, the capability parameters related to the physical adaptation (and the corresponding setting values): ESC_PA, EscParam_PA, PACP_BEGIN, PACP_FunctionID . . . etc., and the capability parameters related to the high speed (HS) mode: MaxHS, RxHSG4PrepareLength, RxHsG4SyncLength, RxHsAdaptResfresh, RxHsAdaptInitial . . . etc. According to an embodiment of the invention, information regarding the operation mode supported by the host device and/or the interface circuit, and/or the operation mode determined and configured by the host device may be carried in a reserved field in the capability indication command PACP_CAP_EXT2_ind, such as the parameter AdMod shown in FIG. 8. According to an embodiment of the invention, the enumerated valid attribute values of the parameter AdMod may comprise 00, 01, 10 and 11, where the value 00 may represent the DUT Auto Mode, the value 01 may represent the Host and Device Inter-Active Mode, the value 10 may represent the Host Initial Adjust Mode and the value 11 may represent the Device Initial Adjust Mode. The protocol layer signal processing circuit (e.g. the signal processing circuit 220) may obtain information regarding the configured operation mode from the received capability indication command, and may provide the information regarding the configured operation mode (or the corresponding operations to be performed in the calibration procedure) to the physical layer signal processing circuit (e.g. the signal processing circuit 210).

According to an embodiment of the invention, in the DUT auto mode, the DUT performs an internal loop calibration to calibrate the TX Swing (e.g., the voltage level of the transmitting signals) and RX Equalization (e.g., the parameters used in the equalization circuit 302) via the internal signal receiving path 313 (that is, the internal loop) at the first half of Adapt period, and the DUT performs an external loop calibration for RX Equalization via the external signal receiving path 312 (that is, the external loop) at the second half of Adapt period.

It is to be noted that in the embodiments of the invention, the DUT may be either the host device (hereinafter named as the "Host") or the interface circuit configured in the memory controller or the data storage device (hereinafter named as the "Device"). In addition, it is to be further noted that since the data storage system including a Host and a Device is a symmetric system, the designs of both the interface circuit in the Host and the interface circuit in the Device are substantially the same. Therefore, the Host and the Device may solely or both calibrate the TX Swing and RX Equalization during the Adapt period, depending on which operation mode is configured to the Host and the Device as will be illustrated in the following paragraphs.

Figure 9:
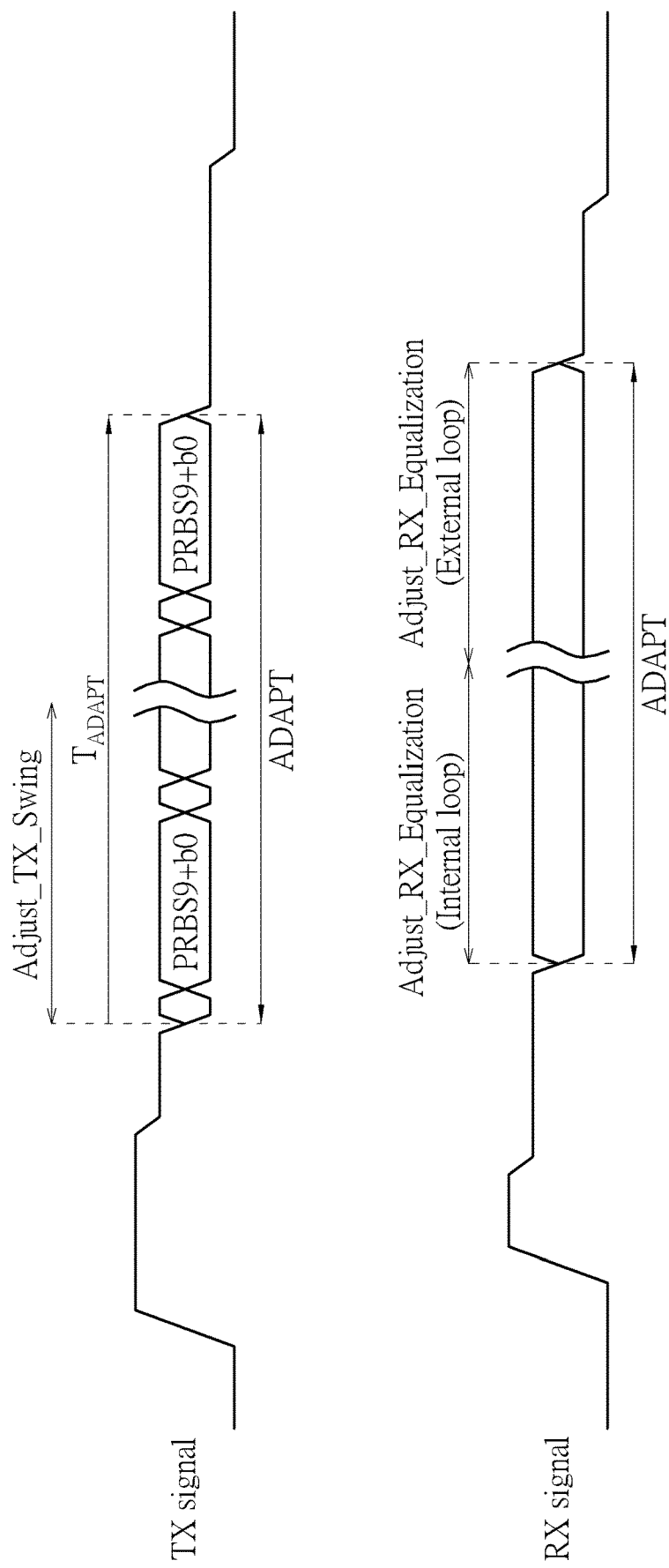
FIG. 9 shows an exemplary waveform of a TX signal transmitted by the DUT and an exemplary waveform of a RX signal received by the DUT when operating in the DUT auto mode according to an embodiment of the invention.

FIG. 9 shows an exemplary waveform of a TX signal (in the upper row) transmitted by the DUT and an exemplary waveform of a RX signal (in the lower row) received by the DUT when operating in the DUT auto mode according to an embodiment of the invention. As shown in FIG. 9, the pseudorandom binary sequence (PRBS) PRBS9 (or, the PRBS9 plus an extra bit b0) is utilized in the first half of Adapt period ADAPT (e.g. the first half of the time interval $T_{ADAPT}$ corresponding to the Adapt period ADAPT) for the DUT to adjust TX swing (e.g. the operation of Adjust_TX_Swing as shown in FIG. 9), and the DUT may further use the TX signal output by the swing control circuit 307 via the internal loop to calibrate or adjust the RX Equalization (e.g. the operation of Adjust_RX_Equalization corresponding to the internal loop as shown in FIG. 9). In the second half of Adapt period ADAPT (e.g. the second half of the time interval $T_{ADAPT}$ corresponding to the Adapt period ADAPT), the DUT calibrates or adjusts RX Equalization via the external loop (e.g. the operation of Adjust_RX_Equalization corresponding to the external loop as shown in FIG. 9).

According to an embodiment of the invention, in the Host and Device Inter-Active Mode, the Host and Device respectively performs an internal loop calibration to calibrate or adjust the TX Swing and RX Equalization via the internal loop at the first half of Adapt period, and the Host and Device respectively performs an external loop calibration to calibrate or adjust the RX Equalization via the external loop at the second half of Adapt period.

Figure 10:
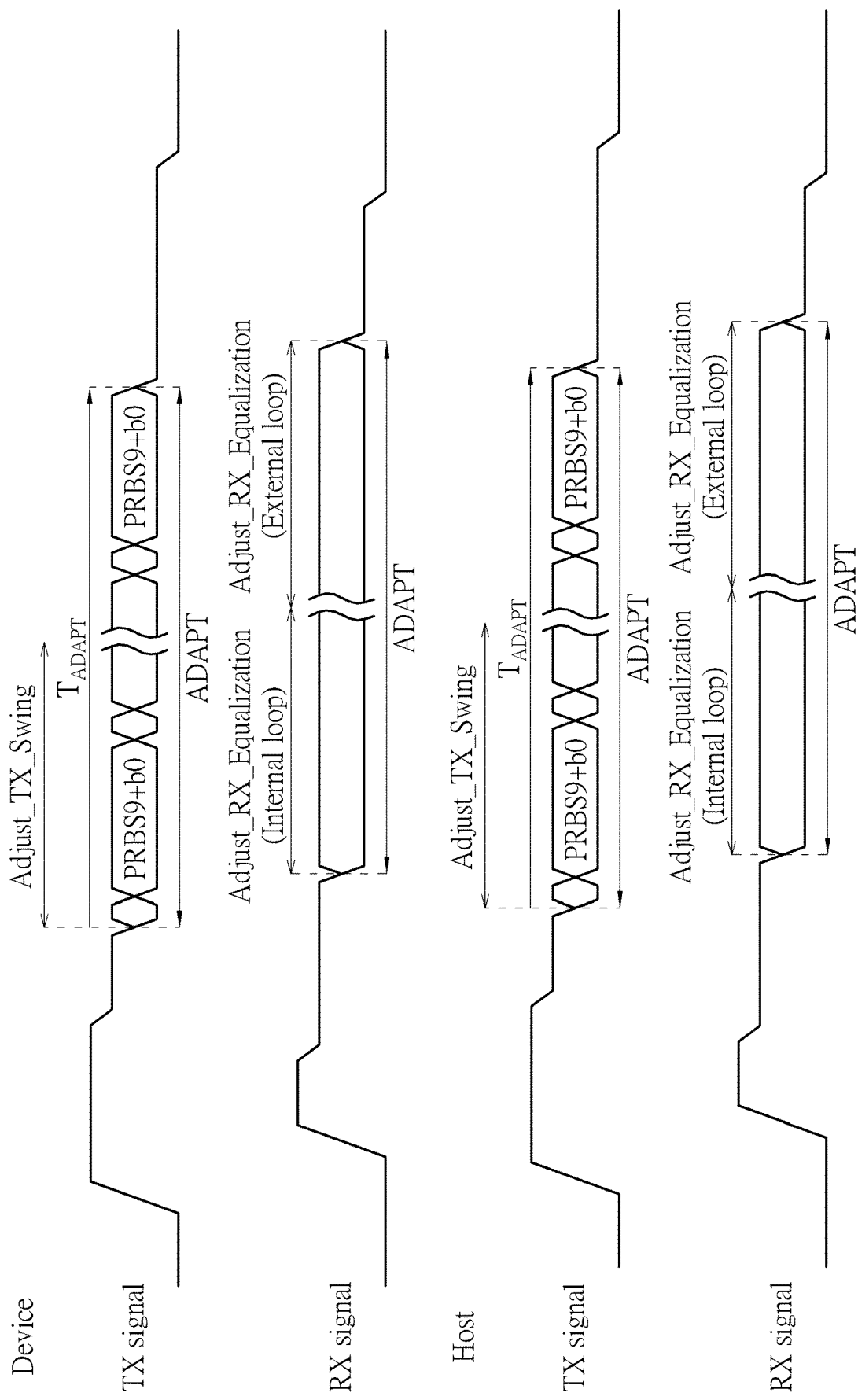
FIG. 10 shows exemplary waveforms of a TX signal and a RX signal of the Device and exemplary waveforms of a TX signal and a RX signal of the Host when operating in the Host and Device Inter-Active Mode according to an embodiment of the invention.

FIG. 10 shows an exemplary waveform of a TX signal (in the first row) transmitted by the Device, an exemplary waveform of a RX signal (in the second row) received by the Device, an exemplary waveform of a TX signal (in the third row) transmitted by the Host and an exemplary waveform of a RX signal (in the fourth row) received by the Host when operating in the Host and Device Inter-Active Mode according to an embodiment of the invention. As shown in FIG. 10, the pseudorandom binary sequence PRBS9 (or, the PRBS9 plus an extra bit b0) is utilized in the first half of Adapt period ADAPT (e.g. the first half of the time interval $T_{ADAPT}$ corresponding to the Adapt period ADAPT) for the Device and the Host to calibrate or adjust TX swing (e.g. the operation of Adjust_TX_Swing as shown in FIG. 10) and the RX Equalization via the internal loop (e.g. the operation of Adjust_RX_Equalization corresponding to the internal loop as shown in FIG. 10), respectively. In the second half of Adapt period ADAPT (e.g. the second half of the time interval $T_{ADAPT}$ corresponding to the Adapt period ADAPT), the Device and the Host respectively calibrate or adjust RX Equalization via their external loop (e.g. the operation of Adjust_RX_Equalization corresponding to the external loop as shown in FIG. 10). The TX signal output by the Device/

Host may be not only provided for the Device/Host to perform the internal loop calibration, but also may be provided for the Host/Device to perform the external loop calibration.

According to an embodiment of the invention, in the Host Initial Adjust Mode, two Adapt periods are required. In the first Adapt period, the Host performs an internal loop calibration to calibrate or adjust the TX Swing and RX Equalization via the internal loop and at the same time the Device performs an external loop calibration to calibrate or adjust the RX Equalization via the external loop. In the second Adapt period, the Device performs an internal loop calibration to calibrate or adjust the TX Swing and RX Equalization via the internal loop and at the same time the Host performs an external loop calibration to calibrate or adjust RX Equalization via the external loop.

Figure 11:
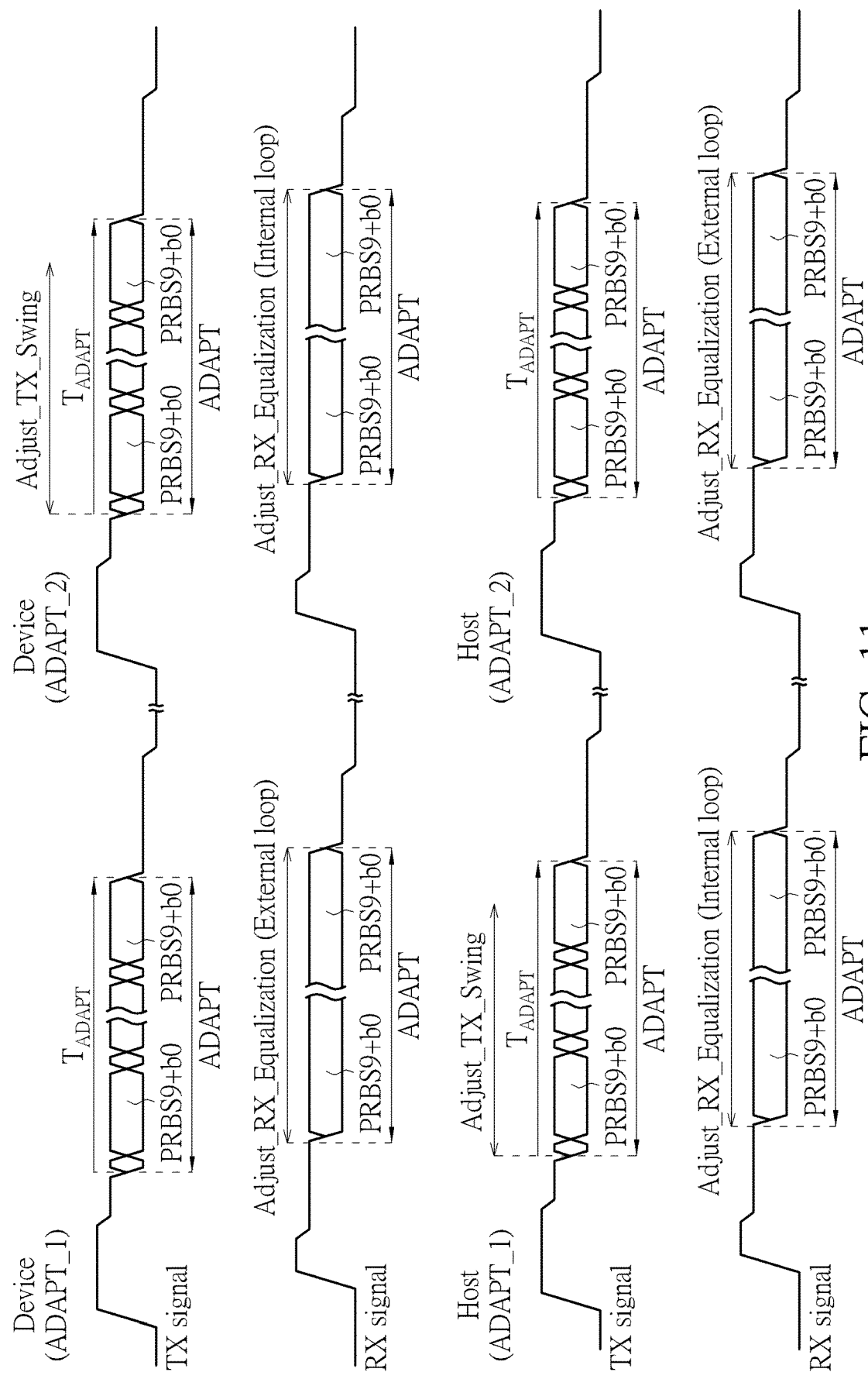
FIG. 11 shows exemplary waveforms of a TX signal and a RX signal of the Device and exemplary waveforms of a TX signal and a RX signal of the Host when operating in the Host Initial Adjust Mode according to an embodiment of the invention.

FIG. 11 shows an exemplary waveform of a TX signal (in the first row) transmitted by the Device, an exemplary waveform of a RX signal (in the second row) received by the Device, an exemplary waveform of a TX signal (in the third row) transmitted by the Host and an exemplary waveform of a RX signal (in the fourth row) received by the Host when operating in the Host Initial Adjust Mode according to an embodiment of the invention.

As shown in FIG. 11, the Device performs an external loop calibration to calibrate or adjust RX Equalization via the external loop (e.g. the operation of Adjust_RX_Equalization corresponding to the external loop as shown in FIG. 11) in the first Adapt period (e.g. the Adapt period ADAPT_1 as shown in FIG. 11) and performs an internal loop calibration to calibrate or adjust the TX Swing (e.g. the operation of Adjust_TX_Swing as shown in FIG. 11) and RX Equalization via the internal loop (e.g. the operation of Adjust_RX_Equalization corresponding to the internal loop as shown in FIG. 11) in the second Adapt period (e.g. the Adapt period ADAPT_2 as shown in FIG. 11).

The Host performs an internal loop calibration to calibrate or adjust the TX Swing (e.g. the operation of Adjust_TX_Swing as shown in FIG. 11) and RX Equalization via the internal loop (e.g. the operation of Adjust_RX_Equalization corresponding to the internal loop as shown in FIG. 11) in the first Adapt period (e.g. the Adapt period ADAPT_1 as shown in FIG. 11) and performs an external loop calibration to calibrate or adjust RX Equalization via the external loop (e.g. the operation of Adjust_RX_Equalization corresponding to the external loop as shown in FIG. 11) in the second Adapt period (e.g. the Adapt period ADAPT_2 as shown in FIG. 11). Therefore, in the Host Initial Adjust Mode, the Host may first perform the internal loop calibration and then perform the external loop calibration, and the calibrations in the Device are arranged in a reverse manner.

According to an embodiment of the invention, in the Device Initial Adjust Mode, two Adapt periods are required. In the first Adapt period, the Device performs an internal loop calibration to calibrate or adjust the TX Swing and RX Equalization via the internal loop and at the same time the Host performs an external loop calibration to calibrate or adjust RX Equalization via the external loop. In the second Adapt period, the Host performs an internal loop calibration to calibrate or adjust the TX Swing and RX Equalization via the internal loop and at the same time the Device performs an external loop calibration to calibrate or adjust RX Equalization via the external loop.

Figure 12:
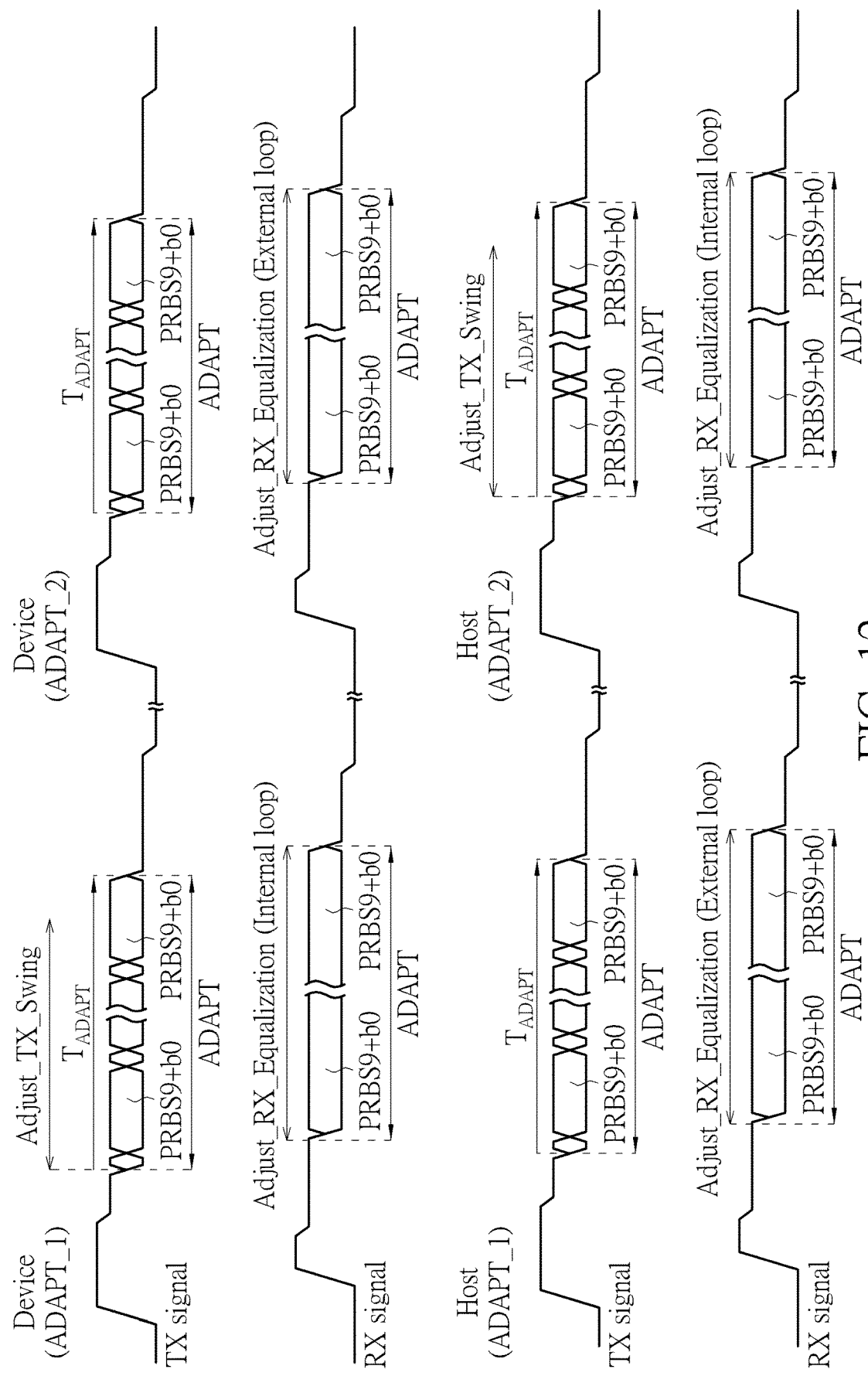
FIG. 12 shows exemplary waveforms of a TX signal and a RX signal of the Device and exemplary waveforms of a TX signal and a RX signal of the Host when operating in the Device Initial Adjust Mode according to an embodiment of the invention.

FIG. 12 shows an exemplary waveform of a TX signal (in the first row) transmitted by the Device, an exemplary waveform of a RX signal (in the second row) received by the Device, an exemplary waveform of a TX signal (in the third row) transmitted by the Host and an exemplary waveform of a RX signal (in the fourth row) received by the Host when operating in the Device Initial Adjust Mode according to an embodiment of the invention.

As shown in FIG. 12, the Device performs an internal loop calibration to calibrate or adjust the TX Swing (e.g. the operation of Adjust_TX_Swing as shown in FIG. 12) and RX Equalization via the internal loop (e.g. the operation of Adjust_RX_Equalization corresponding to the internal loop as shown in FIG. 12) in the first Adapt period (e.g. the Adapt period ADAPT_1 as shown in FIG. 12) and performs an external loop calibration to calibrate or adjust RX Equalization via the external loop (e.g. the operation of Adjust_RX_Equalization corresponding to the external loop as shown in FIG. 12) in the second Adapt period (e.g. the Adapt period ADAPT_2 as shown in FIG. 12).

The Host performs an external loop calibration to calibrate or adjust RX Equalization via the external loop (e.g. the operation of Adjust_RX_Equalization corresponding to the external loop as shown in FIG. 12) in the first Adapt period (e.g. the Adapt period ADAPT_1 as shown in FIG. 12) and performs an internal loop calibration to calibrate or adjust the TX Swing (e.g. the operation of Adjust_TX_Swing as shown in FIG. 12) and RX Equalization via the internal loop (e.g. the operation of Adjust_RX_Equalization corresponding to the internal loop as shown in FIG. 12) in the second Adapt period (e.g. the Adapt period ADAPT_2 as shown in FIG. 12). Therefore, in the Device Initial Adjust Mode, the Device may first perform the internal loop calibration and then perform the external loop calibration, and the calibrations in the Host are arranged in a reverse manner.

It is to be noted that, in the embodiments of the invention, for the Host Initial Adjust Mode and the Device Initial Adjust Mode, two power mode change requests may be required. For example, when operating in the Host Initial Adjust Mode or the Device Initial Adjust Mode, the host may issue two power mode change requests so as to obtain two Adapt periods.

In addition, in the embodiments of the invention, in the proposed calibration procedure, as in the operation modes illustrated above, the equalization circuit 302 is configured to sequentially process the received signal received from the external signal receiving path 312 and the received signal received from the internal signal receiving path 313. In the embodiments of the invention, the calibration device 330 may control whether to provide the signal received from the external signal receiving path 312 to the equalization circuit 302 or to provide the signal received from the internal signal receiving path 313 to the equalization circuit 302 via one or more switches (not shown).

In the embodiments of the invention, when calibrating or adjusting the TX swing in the calibration procedure, such as in the Adapt periods as shown from FIG. 9 to FIG. 12, the control circuit 420 may adjust the voltage level of transmitting signals output by the swing control circuit 307 based on a difference between a target TX voltage level and the probe results of the voltage level of transmitting signals provided by the probe circuit 430, or, the control circuit 420 may adjust the voltage level of transmitting signals output by the swing control circuit 307 based on the attributes of the data signals output by the equalization circuit 302 and probed by the probe circuit 430. As an example, when the data signals output by the equalization circuit 302 is determined as unrecognizable or the equalization circuit 302 is unable to successfully receive the transmitting signals provided by the swing control circuit 307 via the internal signal receiving path 313, the control circuit 420 may determine to increase the voltage level of transmitting signals output by the swing control circuit 307 since the original setting seems to be insufficient for the equalization circuit 302 to successfully receive and/or to recover the data.

In the embodiments of the invention, when calibrating or adjusting the RX Equalization in the calibration procedure, such as in the Adapt periods as shown from FIG. 9 to FIG. 12, the control circuit 420 may adjust the equalization parameter of the equalization circuit 302 based on the probe results provided by the probe circuit 430. As an example, the control circuit 420 may create an eye diagram for the voltage level of the data signals output by the equalization circuit 302 and probed by the probe circuit 430 and adjust the equalization parameter based on the eye diagram. For example, the control circuit 420 may adaptively adjust the gain of the CTLE based on the eye diagram created according to the probe results provided by the probe circuit 430 until a clear eye diagram is presented. Noted that the control circuit 420 may also adaptively adjust the voltage level of transmitting signals output by the swing control circuit 307 based on the eye diagram in the similar way.

By applying the proposed method for calibrating multiple signal processing devices in an interface circuit during the calibration procedure, which is an advanced or improved Adapt Equalization as compared to the conventional Adapt Equalization, the characteristic values of the signal processing devices inside the serializer-deserializer can be accurately calibrated, thereby avoiding the frequency or voltage jitter, which may eventually cause the problem of fatal errors in the system, to be generated by the signal processing device due to the deviation of the characteristic values.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interface circuit, comprising:
   a first signal processing device, disposed on a receiving signal processing path and configured to process a received signal;
   a second signal processing device, disposed on a transmitting signal processing path and configured to process a transmitting signal; and
   a calibration device, coupled to the first signal processing device and the second signal processing device and configured to calibrate a characteristic value of the first signal processing device and a characteristic value of the second signal processing device in a calibration procedure,
   wherein the first signal processing device is coupled to an external signal receiving path and an internal signal receiving path and is configured to sequentially process the received signal received from the external signal receiving path and the received signal received from the internal signal receiving path in the calibration procedure, and
   wherein the second signal processing device is coupled to the first signal processing device via the internal signal receiving path and is configured to provide the transmitting signal to the first signal processing device in the calibration procedure.

2. The interface circuit as claimed in claim 1, wherein the interface circuit is comprised in a data storage device, and the calibration procedure is triggered in responsive of a power mode change request issued by a host device coupled to the data storage device.

3. The interface circuit as claimed in claim 2, wherein the calibration procedure is triggered when activation of an adapt equalization is indicated in the power mode change request.

4. The interface circuit as claimed in claim 2, wherein the calibration device is further configured to operate based on an operation mode of the interface circuit in the calibration procedure, and the operation mode is negotiated with the host device in a link up process.

5. The interface circuit as claimed in claim 4, wherein the operation mode is negotiated in the link up process via at least one capability indication command.

6. The interface circuit as claimed in claim 1, further comprising:
   a Serializer-Deserializer (SerDes) physical layer signal processing circuit, wherein the first signal processing device, the second signal processing device and the calibration device is comprised in the SerDes physical layer signal processing circuit.

7. A memory controller, coupled to a memory device for controlling access operations of the memory device, comprising:
   an interface circuit, coupled to a host device and configured to communicate with the host device, wherein the interface circuit comprises:
   a first signal processing device, disposed on a receiving signal processing path and configured to process a received signal;
   a second signal processing device, disposed on a transmitting signal processing path and configured to process a transmitting signal; and
   a calibration device, coupled to the first signal processing device and the second signal processing device and configured to calibrate a characteristic value of the first signal processing device and a characteristic value of the second signal processing device in a calibration procedure,
   wherein the first signal processing device is coupled to an external signal receiving path and an internal signal receiving path and is configured to sequentially process the received signal received from the external signal receiving path and the received signal received from the internal signal receiving path in the calibration procedure, and
   wherein the second signal processing device is coupled to the first signal processing device via the internal signal receiving path and is configured to provide the transmitting signal to the first signal processing device in the calibration procedure.

8. The memory controller as claimed in claim 7, wherein the calibration procedure is triggered in responsive of a power mode change request issued by the host device.

9. The memory controller as claimed in claim 8, wherein the calibration procedure is triggered when activation of an adapt equalization is indicated in the power mode change request.

10. The memory controller as claimed in claim 7, wherein the calibration device is further configured to operate based on an operation mode of the interface circuit in the calibration procedure, and the interface circuit negotiates the operation mod with the host device in a link up process.

11. The memory controller as claimed in claim 10, wherein the operation mode is negotiated in the link up process via at least one capability indication command.

12. The memory controller as claimed in claim 7, further comprising:
   a Serializer-Deserializer (SerDes) physical layer signal processing circuit, wherein the first signal processing device, the second signal processing device and the calibration device is comprised in the SerDes physical layer signal processing circuit.

13. A method for calibrating a plurality of signal processing devices in an interface circuit of a memory controller, wherein the memory controller is coupled to a memory device for controlling access to the memory device and comprised in a data storage device which is coupled to a host device, and the method comprises:
   negotiating with the host device in a link up process about an operation mode for the interface circuit to operate in a calibration procedure; and
   calibrating a characteristic value of a first signal processing device and a characteristic value of a second signal processing device in the calibration procedure, wherein the first signal processing device is disposed on a receiving signal processing path of the interface circuit and configured to process a received signal and the second signal processing device is disposed on a transmitting signal processing path of the interface circuit and configured to process a transmitting signal, and
   wherein the interface circuit is configured to operate based on the operation mode in the calibration procedure.

14. The method as claimed in claim 13, wherein the calibration procedure is triggered in responsive of a power mode change request issued by the host device.

15. The method as claimed in claim 14, wherein the calibration procedure is triggered when activation of an adapt equalization is indicated in the power mode change request.

16. The method as claimed in claim 13, wherein the operation mode is negotiated in the link up process via at least one capability indication command.

17. The method as claimed in claim 13, wherein step of calibrating the characteristic value of the first signal processing device and the characteristic value of the second signal processing device in the calibration procedure further comprises:
   calibrating the characteristic value of the first signal processing device by using an external signal receiving path and an internal signal receiving path,
   wherein the first signal processing device is coupled to both the external signal receiving path and the internal signal receiving path and is configured to sequentially process the received signal received from the external signal receiving path and the received signal received from the internal signal receiving path in the calibration procedure, and
   wherein the second signal processing device is coupled to the first signal processing device via the internal signal receiving path and is configured to provide the transmitting signal to the first signal processing device in the calibration procedure.

* * * * *